(12) United States Patent
Aihara

(10) Patent No.: US 7,625,789 B2
(45) Date of Patent: Dec. 1, 2009

(54) METHOD FOR MANUFACTURING SEMICONDUCTOR DEVICE

(75) Inventor: Yasuki Aihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 108 days.

(21) Appl. No.: 11/969,990

(22) Filed: Jan. 7, 2008

(65) Prior Publication Data

US 2008/0280400 A1 Nov. 13, 2008

(30) Foreign Application Priority Data

May 10, 2007 (JP) ............................. 2007-126017

(51) Int. Cl.
*H01L 21/338* (2006.01)
(52) U.S. Cl. .................. 438/182; 438/199; 438/239; 257/E21.616
(58) Field of Classification Search ................ 438/182, 438/197, 199, 200, 271, 239; 257/E21.19, 257/E21.615, E21.616
See application file for complete search history.

(56) References Cited

U.S. PATENT DOCUMENTS

2007/0267705 A1\* 11/2007 Won et al. .................... 257/379

FOREIGN PATENT DOCUMENTS

| JP | 7-22310 | 1/1995 |
| JP | 7-235644 | 9/1995 |

\* cited by examiner

*Primary Examiner*—Thanhha Pham
(74) *Attorney, Agent, or Firm*—Leydig, Voit & Mayer, Ltd.

(57) ABSTRACT

A field effect transistor having a T-shaped gate electrode is formed on a GaAs substrate, and the T-shaped gate electrode of the field effect transistor is coated with a $SiO_2$ film. A lower electrode of a MIM capacitor is formed on the GaAs substrate. The active portion of the field effect transistor is coated with a fluorine-containing polymer layer. A SiN film, which is a capacity insulating film of the MIM capacitor, is formed on the fluorine-containing polymer layer and the lower electrode. After removing the SiN film from the fluorine-containing polymer layer, the fluorine-containing polymer layer is selectively removed from the $SiO_2$ film and the SiN film. An upper electrode of the MIM capacitor is formed opposite the lower electrode on the SiN film.

2 Claims, 7 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device equipped with a recessed field effect transistor having a T-shaped gate electrode and a MIM capacitor, and specifically to a method for manufacturing a semiconductor device that has no problem of lift-off properties and no corrosion of a T-shaped gate electrode, and can prevent the elevation of the parasitic capacitance of the field effect transistor.

2. Background Art

A conventional method for manufacturing a semiconductor device equipped with a recessed field effect transistor having a T-shaped gate electrode and a MIM capacitor will be described. First, a field effect transistor and a lower electrode of a MIM capacitor are formed on a semiconductor substrate. Then, the T-shaped gate electrode of the field effect transistor is coated with a protective insulating film. Next, a capacity insulating film of the MIM capacitor is formed so as to coat the field effect transistor and the lower electrode. Here, a $SiO_2$ film is used as the protective film, and a SiN film is used as the capacity insulating film. Next, using the selection ratio of $SiO_2$ and SiN, the capacity insulating film on the field effect transistor is etched back by a RIE process. Then, an upper electrode of the MIM capacitor is formed on the capacity insulating film.

By the conventional method, however, it is difficult to completely remove the capacity insulating film to the space under the T-shaped gate electrode. Therefore, there is a problem that the parasitic capacitance of the field effect transistor is elevated.

Alternatively, there is a method wherein the capacity insulating film of a MIM capacitor is formed in the state wherein a portion including the active region of a field effect transistor is coated with a sacrifice layer, and thereafter, the sacrifice layer is lifted off. However, when the capacity insulating film is formed by a p-CVD process or the like, since the capacity insulating film easily goes onto the sacrifice layer, there is a problem that the sacrifice layer is difficult to lift off.

A method wherein a MIM capacitor is formed in the state wherein after the T-shaped gate electrode is coated with a $SiO_2$ film, and subsequently the $SiO_2$ film is removed with buffered hydrofluoric acid has been proposed (for example, refer to Japanese Patent Laid-Open No. 7-235644). However, when Ti or Al is used as the T-shaped gate electrode, there is a problem that the T-shaped gate electrode is corroded by hydrofluoric acid.

SUMMARY OF THE INVENTION

To solve the above-described problems, an object of the present invention is to provide a method for manufacturing a semiconductor device wherein there are no problems of lift-off properties and the corrosion of a T-shaped gate electrode, and can prevent the elevation of parasitic capacity of a field effect transistor.

According to one aspect of the present invention, a method for manufacturing a semiconductor device comprises a step for forming a field effect transistor having a T-shaped gate electrode on a semiconductor substrate, and coating said T-shaped gate electrode of the field effect transistor with a protective insulating film; a step for forming a lower electrode of a MIM capacitor on said semiconductor substrate; a step for coating the active portion of said field effect transistor with a sacrifice layer; a step for forming a capacity insulating film of said MIM capacitor on said sacrifice layer and said lower electrode: a step for removing said capacity insulating film on said sacrifice layer, and selectively removing said sacrifice layer from said protective insulating film and said capacity insulating film; and a step for forming an upper electrode of said MIM capacitor on said lower electrode via said capacity insulating film.

According to the present invention, the elevation of parasitic capacity of a field effect transistor can be prevented without the problems of lift-off properties and the corrosion of a T-shaped gate electrode.

Other and further objects, features and advantages of the invention will appear more fully from the following description.

DETAILED DESCRIPTION OF THE PREFERRED EMBODIMENTS

First Embodiment

Figure 1:
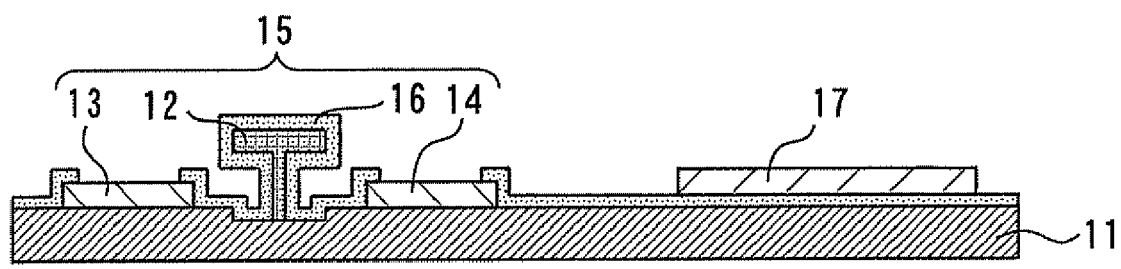
FIGS. 1-7 are sectional views for explaining a method of manufacturing a semiconductor device according to First Embodiment of the present invention.

A method for manufacturing a semiconductor device according to the first embodiment of the present invention will be described below referring to the drawings.

First, as shown in FIG. 1, a field effect transistor 15 having a T-shaped gate electrode 12, a source electrode 13 and a drain electrode 14 is formed on a GaAs substrate 11 (semiconductor substrate), in which Ti or Al is used as a material for the T-shaped gate electrode 12. A $SiO_2$ film 16 (protective insulating film) is formed by a p-CVD process or the like such that the T-shaped gate electrode 12 of the field effect transistor 15 is coated with the $SiO_2$ film 16. A lower electrode 17 of a MIM capacitor is formed on the GaAs substrate 11.

Figure 2:
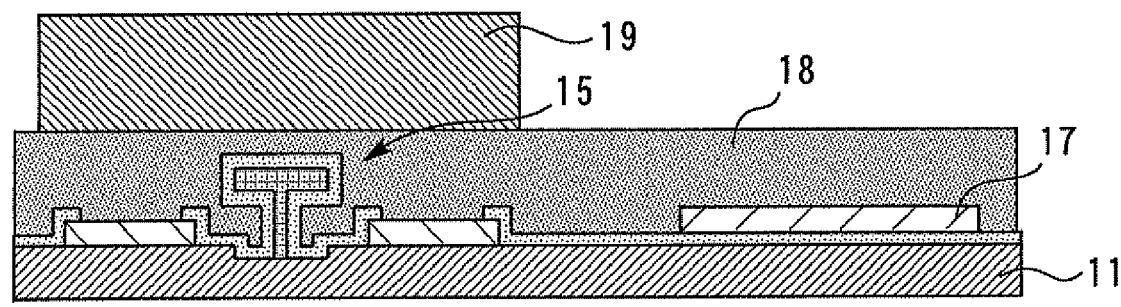

Next, as shown in FIG. 2, a fluorine-containing polymer layer 18 (sacrifice layer) is applied by spin coating. Here, a material having a three-dimensional network structure, whose glass transition temperature is elevated to about 350° C. by introducing benzene rings, is used for the fluorine-containing polymer layer 18. A photo-resist 19 is formed on the fluorine-containing polymer layer 18 so as to coat at least the active portion of the field effect transistor 15.

Figure 3:
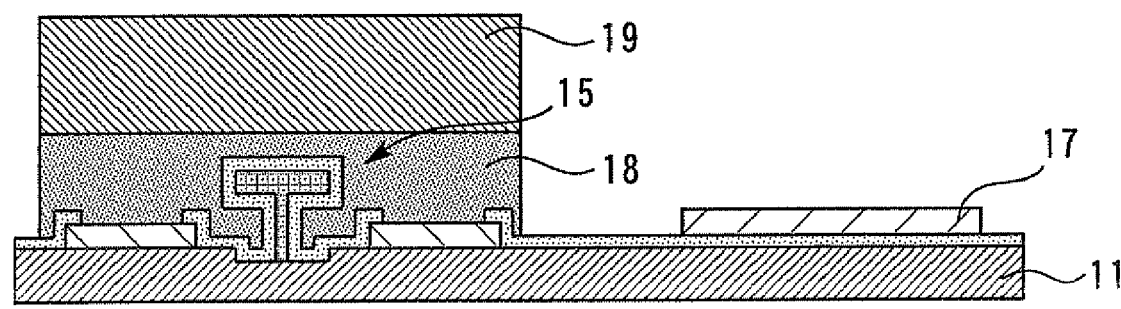

Next, as shown in FIG. 3, the fluorine-containing polymer layer 18 on the area not coated with the photo-resist 19 is removed by exposing the fluorine-containing polymer layer 18 to $O_2$ plasma. Thereby, the active portion of the field effect transistor 15 is coated with the fluorine-containing polymer layer 18. Thereafter, the photo-resist 19 is removed.

Figure 4:
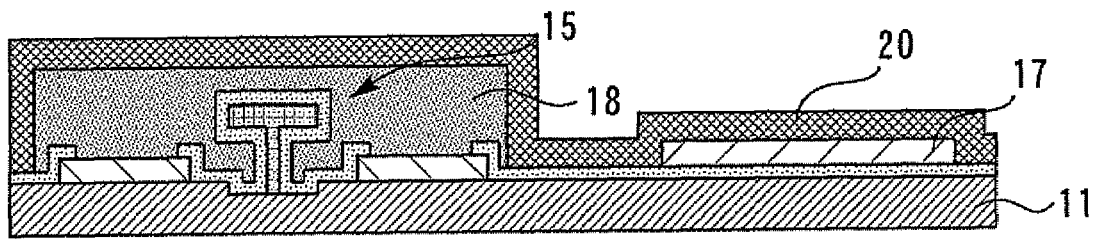

Next, as shown in FIG. 4, a SiN film 20, which is a capacity insulating film of a MIM capacitor, is formed on the fluorine-containing polymer layer 18 and the lower electrode 17 using a p-CVD method.

Figure 5:
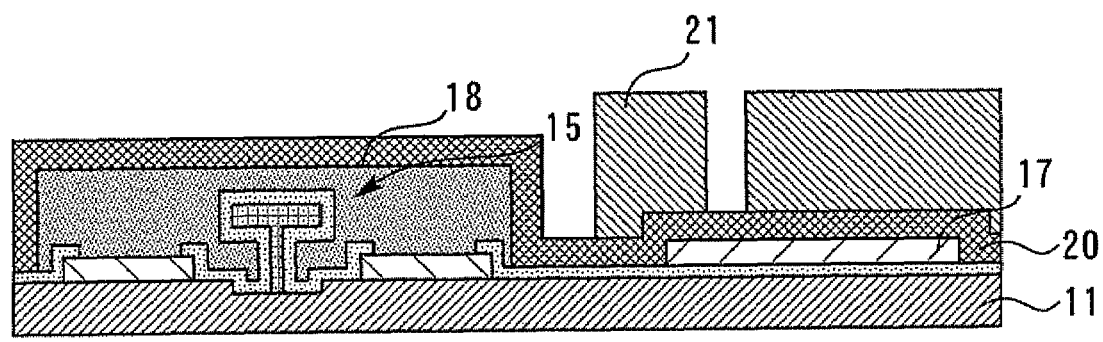

Next, as shown in FIG. 5, a photo-resist 21 is formed so as to open where a contact hole (described below) to the lower electrode 17 is formed and around the fluorine-containing polymer layer 18.

Figure 6:
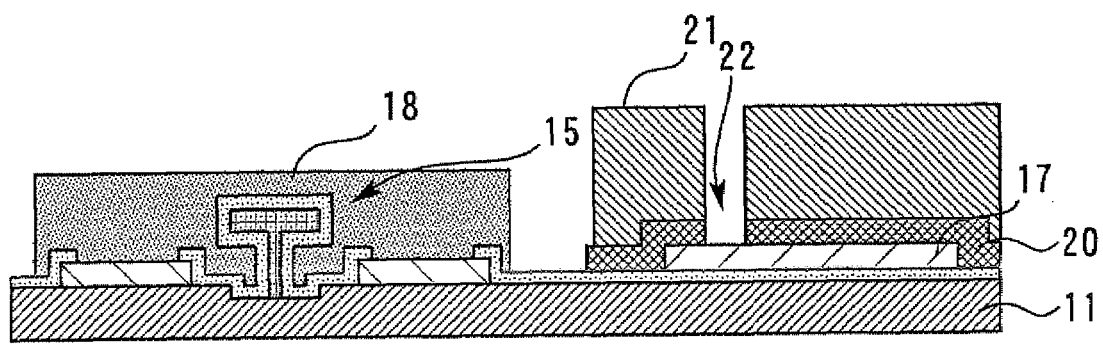

Next, as shown in FIG. 6, the SiN film 20 on the fluorine-containing polymer layer 18 is removed by dry etching using the photo-resist 21 as a mask, and a contact hole 22 is formed in the SiN film 20. Thereafter, the photo-resist 21 is removed.

Figure 7:
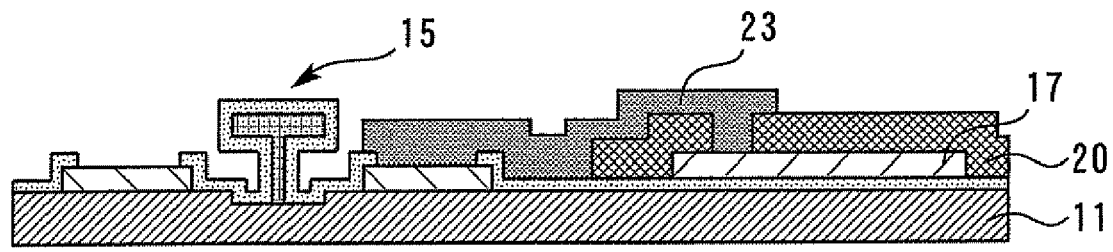

Next, as shown in FIG. 7, the fluorine-containing polymer layer 18 is selectively removed from the $SiO_2$ film 16 and the SiN film 20 by exposing the fluorine-containing polymer layer 18 to $O_2$ plasma. Here, since the $SiO_2$ film 16 has sufficient etching resistance to $O_2$ plasma, even the fluorine-containing polymer layer 18 that has entered in the recess can also be completely removed by treating over a sufficient time. Then, an upper electrode 23 of the MIM capacitor is formed on the lower electrode via the SiN film 20. By the above-described steps, the semiconductor device according to the first embodiment of the present invention can be manufactured.

As described above, when the SiN film 20 is formed in the state wherein the active portion of the field effect transistor is coated with the fluorine-containing polymer layer 18, the SiN film 20 does not remain around the field effect transistor, and the elevation of the parasitic capacitance of the field effect transistor can be prevented.

Also since the fluorine-containing polymer layer 18 is removed after removing the SiN film 20 on the fluorine-containing polymer layer 18 instead of lifting off, no problem of lift-off properties arises. Furthermore, since the field effect transistor is coated with the $SiO_2$ film 16, and the fluorine-containing polymer layer 18 is selectively removed from the $SiO_2$ film 16 and the SiN film 20, the T-shaped gate electrode 12 is not corroded.

A material other than the fluorine-containing polymer layer 18 can also be used as long as the material resists the film-forming temperature by the p-CVD method, and a removing method having selectivity to the SiN film and the $SiO_2$ film can be applied to the material.

Second Embodiment

A method for manufacturing a semiconductor device according to the second embodiment of the present invention will be described below referring to the drawings.

Figure 8:
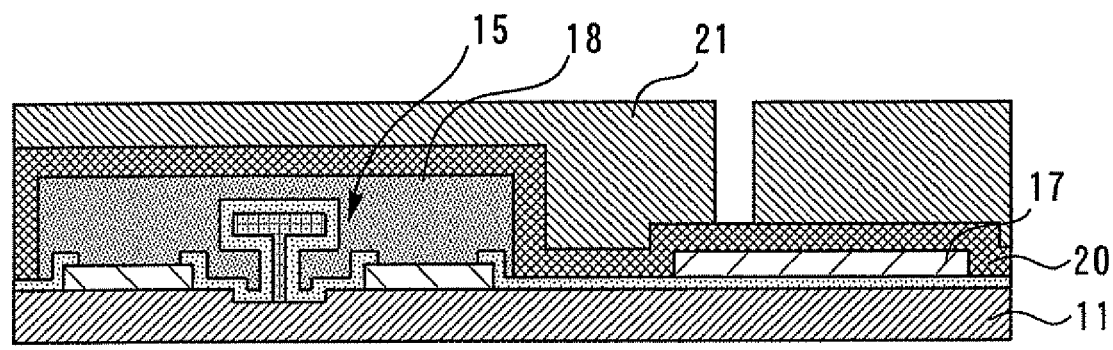
FIGS. 8-10 are sectional views for explaining a method of manufacturing a semiconductor device according to Second Embodiment of the present invention.

First, steps shown in FIGS. 1 to 4 are carried out in the same manner as in the first embodiment. Next, as shown in FIG. 8, a photo-resist 21 is formed so as to open where a contact hole (described below) to the lower electrode 17 is formed.

Figure 9:
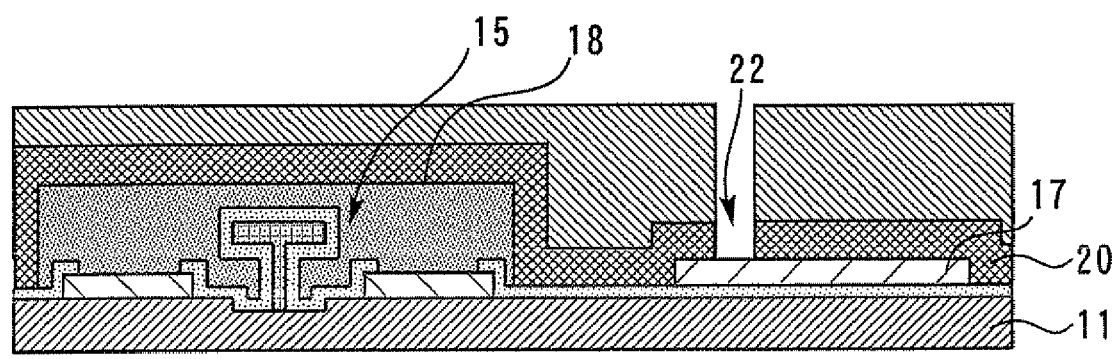

Next, as shown in FIG. 9, a contact hole 22 penetrating through the SiN film 20 is formed by dry etching using the photo-resist 21 as a mask. Thereafter, the photo-resist 21 is removed.

Figure 10:
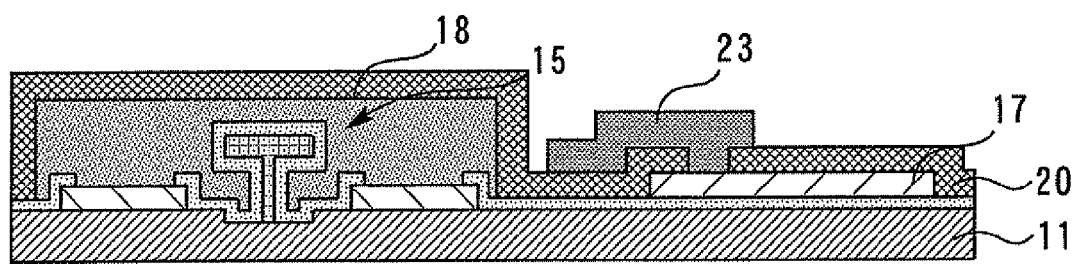

Next, as shown in FIG. 10, an upper electrode 23 of a MIM capacitor is formed on the lower electrode via the SiN film 20. By the above-described steps, the semiconductor device according to the second embodiment of the present invention can be manufactured.

As described above, when the SiN film 20 is formed in the state wherein the active portion of the field effect transistor 15 is coated with the fluorine-containing polymer layer 18 (relative permittivity: about 2.5) having a lower relative permittivity than the SiN film 20 (relative permittivity: about 7), the elevation of the parasitic capacitance of the field effect transistor 15 can be prevented compared with directly forming the SiN film 20 on the field effect transistor 15.

Also since no lifting off is performed, no problem of lift-off properties arises. Furthermore, since the field effect transistor 15 is coated with the fluorine-containing polymer layer 18, the T-shaped gate electrode 12 is not corroded due to exposure to the etchant.

Third Embodiment

A method for manufacturing a semiconductor device according to the third embodiment of the present invention will be described below referring to the drawings.

First, in the same manner as in the first embodiment, a field effect transistor 15 having a T-shaped gate electrode, and a lower electrode of a MIM capacitor are formed on a GaAs substrate 11.

Figure 11:
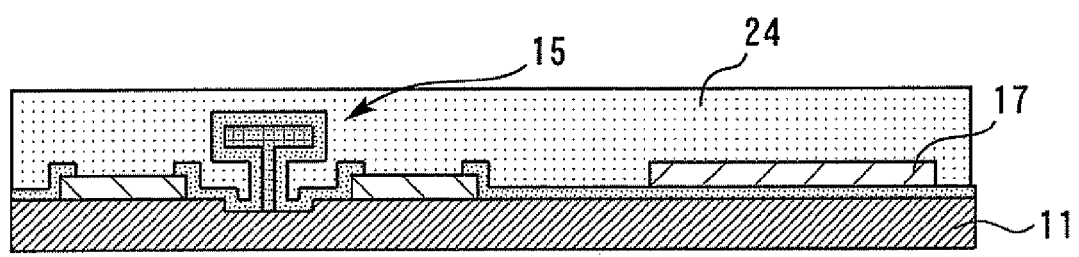
FIGS. 11-15 are sectional views for explaining a method of manufacturing a semiconductor device according to Third Embodiment of the present invention.
Figure 12:
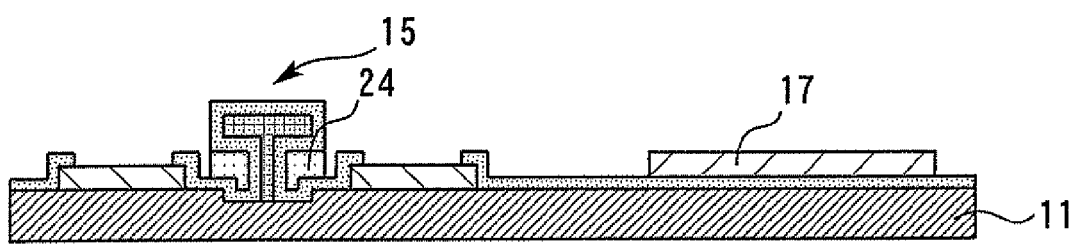

Next, as shown in FIG. 11, polyimide 24 having positive photosensitivity (positive photosensitive material) is applied on the field effect transistor 15 by spin coating. Then, as shown in FIG. 12, the entire surface is exposed and the polyimide 24 is developed. Here, since the areas under the T-shaped gate electrode 12 are shadowed and not exposed, the polyimide 24 remains after developing.

Figure 13:
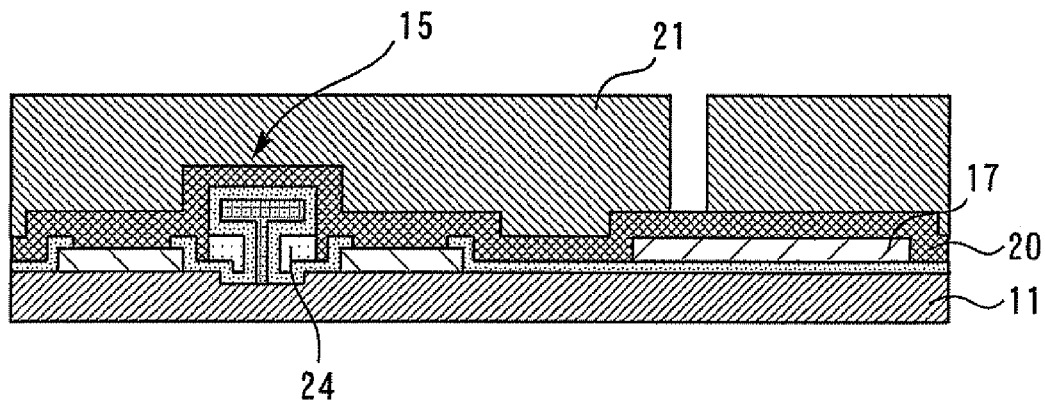

Next, as shown in FIG. 13, a SiN film 20 of the MIM capacitor is formed on an area including at least the lower electrode 17 by a p-CVD method. Then, a photo-resist 21 is formed so as to open where a contact hole (described below) to the lower electrode 17 is formed.

Figure 14:
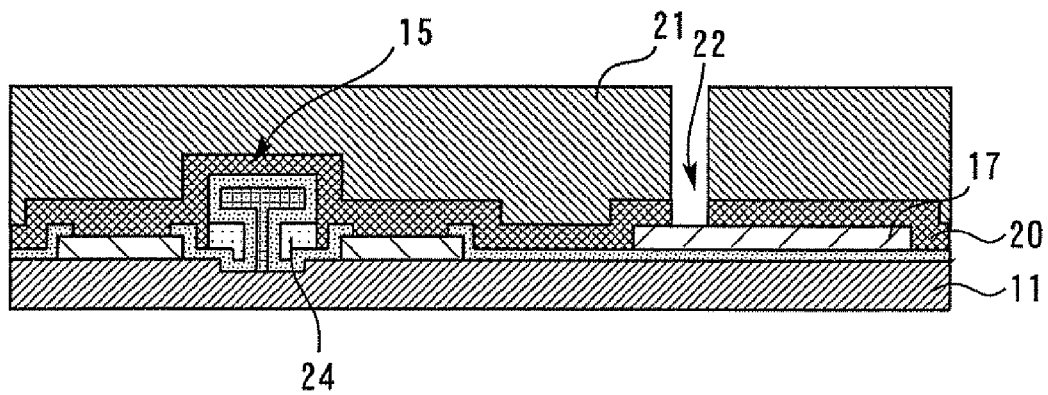

Next, as shown in FIG. 14, a contact hole 22 penetrating through the SiN film 20 is formed by dry etching using the photo-resist 21 as a mask. Thereafter, the photo-resist 21 is removed.

Figure 15:
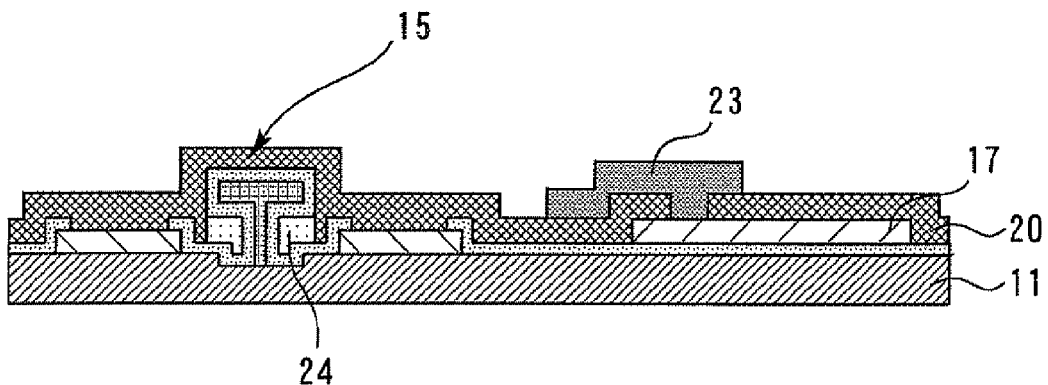

Next, as shown in FIG. 15, an upper electrode 23 of a MIM capacitor is formed on the lower electrode via the SiN film 20. By the above-described steps, the semiconductor device according to the third embodiment of the present invention can be manufactured.

As described above, after the polyimide 24 has been applied onto the field effect transistor 15, and the entire surface has been exposed and developed, the polyimide 24 remains only in the area under the T-shaped gate electrode 12. The polyimide 24 has a lower relative permittivity (relative permittivity: about 4) than the SiN film 20 (relative permittivity: about 7). Therefore, since the relative permittivity in the areas under the T-shaped gate electrode 12 strongly affecting the parasitic capacitance can be reduced compared with directly forming the SiN film 20 on the field effect transistor 15, the elevation of the parasitic capacitance of the field effect transistor 15 can be prevented.

Also since no lifting off is performed, no problem of lift-off properties arises. Furthermore, the T-shaped gate electrode 12 is not corroded due to exposure to the etchant.

Fourth Embodiment

A method for manufacturing a semiconductor device according to the fourth embodiment of the present invention will be described below referring to the drawings.

First, in the same manner as in the first embodiment, a field effect transistor 15 having a T-shaped gate electrode, and a lower electrode of a MIM capacitor are formed on a GaAs substrate 11.

Figure 16:
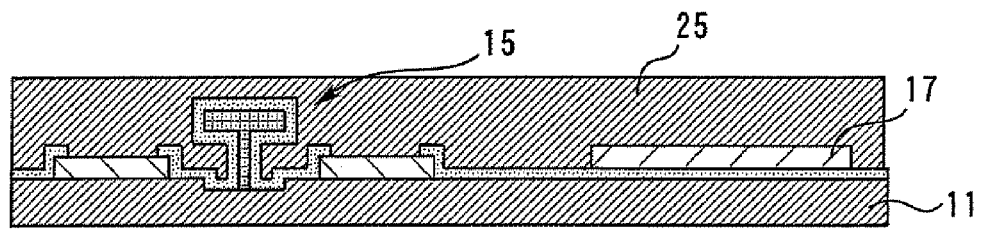
FIGS. 16-21 are sectional views for explaining a method of manufacturing a semiconductor device according to Fourth Embodiment of the present invention.
Figure 17:
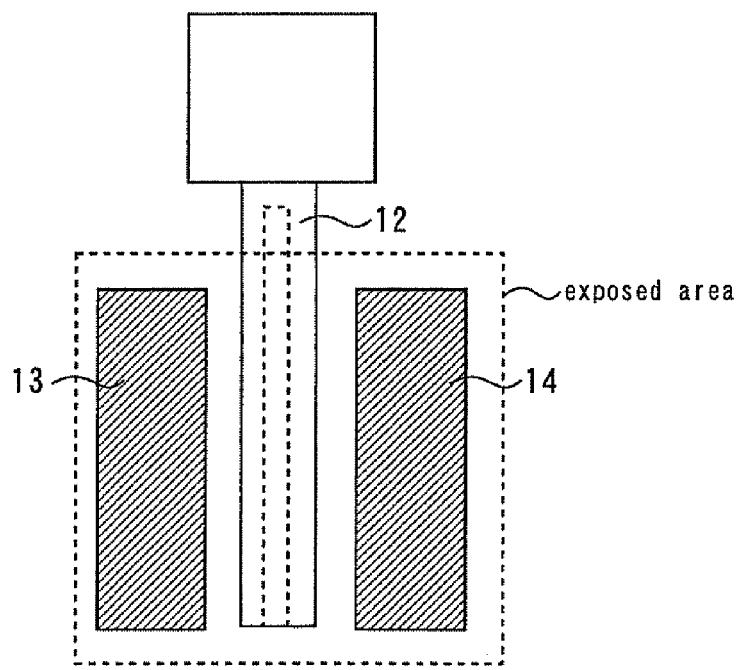
Figure 18:
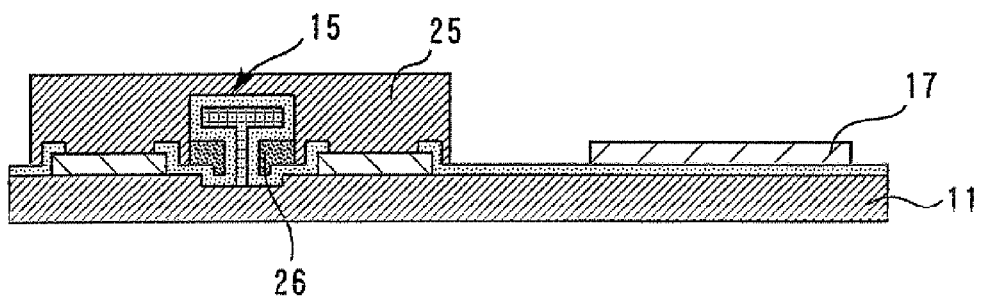

Next, as shown in FIG. 16, polyimide 25 having negative photosensitivity (negative photosensitive material) is applied on the field effect transistor 15 by spin coating. Then, as shown in FIG. 17, the active portion of the field effect transistor 15 is exposed and the polyimide 25 is developed. Thereby, since the areas under the T-shaped gate electrode 12 are shadowed and not exposed as shown in FIG. 18, the polyimide 25 remains around the field effect transistor 15 after developing; however, the areas under the T-shaped gate electrode 12 become hollow spaces 26.

Figure 19:
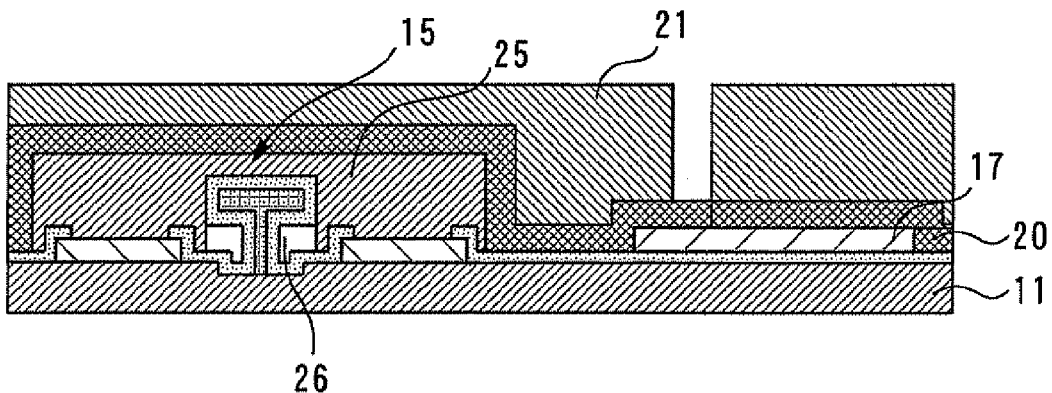

Next, as shown in FIG. 19, a SiN film 20 of the MIM capacitor is formed at least in the region containing the lower electrode 17 by a p-CVD method. Then, a photo-resist 21 is formed so as to open where a contact hole (described below) to the lower electrode 17 is formed.

Figure 20:
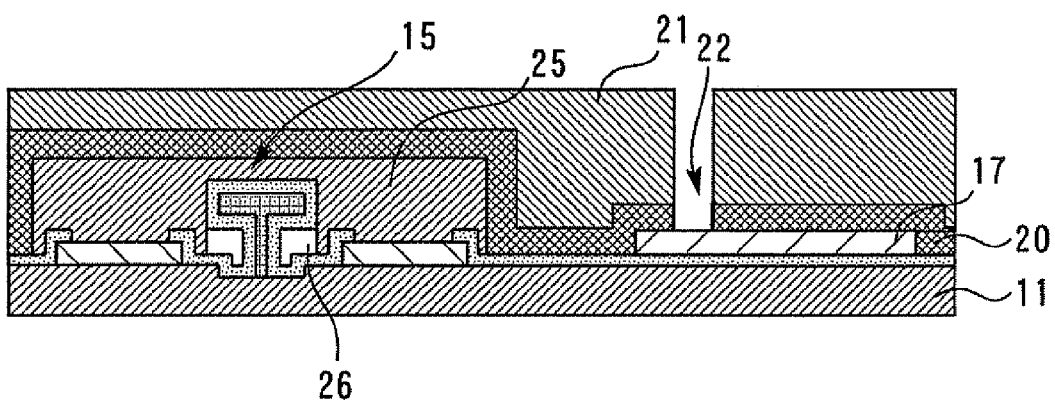

Next, as shown in FIG. 20, a contact hole 22 penetrating through the SiN film 20 is formed by dry etching using the photo-resist 21 as a mask. Thereafter, the photo-resist 21 is removed.

Figure 21:
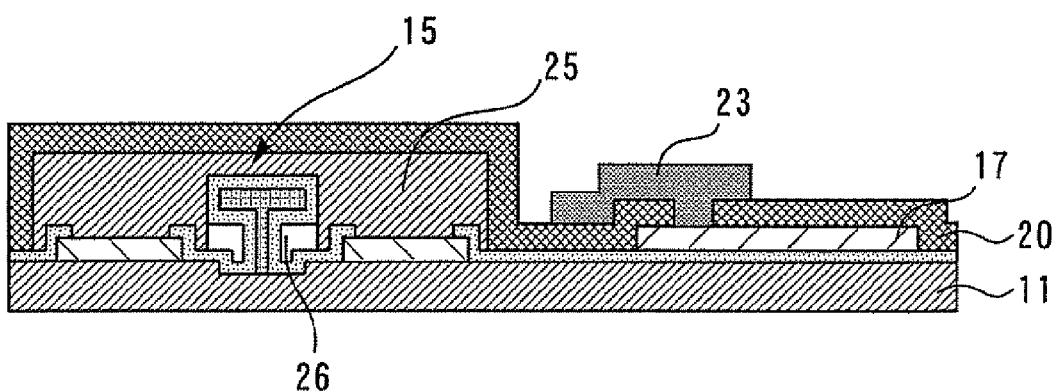

Next, as shown in FIG. 21, an upper electrode 23 of a MIM capacitor is formed on the lower electrode via the SiN film 20. By the above-described steps, the semiconductor device according to the fourth embodiment of the present invention can be manufactured.

As described above, after the polyimide 25 having negative photosensitivity has been applied onto the field effect transistor 15, and at least the active portion of the field effect transistor 15 has been exposed and developed, although the polyimide 25 remains around the field effect transistor 15, the areas under the T-shaped gate electrode 12 become hollow spaces 26. Thereby, since the relative permittivity in the areas under the T-shaped gate electrode 12 strongly affecting the parasitic capacitance can be reduced compared with directly forming the SiN film 20 on the field effect transistor 15, the elevation of the parasitic capacitance of the field effect transistor 15 can be prevented.

Also since no lifting off is performed, no problem of lift-off properties arises. Furthermore, the T-shaped gate electrode 12 is not corroded due to exposure to the etchant.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-126017, filed on May 10, 2007 including specification, claims, drawings and summary, on which the Convention priority of the present application is based, are incorporated herein by reference in its entirety.

What is clamed is:

1. A method for manufacturing a semiconductor device comprising:
    forming a field effect transistor having a T-shaped gate electrode on a semiconductor substrate, and coating said T-shaped gate electrode of said field effect transistor with a protective insulating film;
    forming a lower electrode of a MIM capacitor on said semiconductor substrate;
    coating an active portion of said field effect transistor with a sacrificial layer;
    forming a capacitance insulating film of said MIM capacitor on said sacrificial layer and said lower electrode:
    removing said capacitance insulating film from said sacrificial layer, and selectively removing said sacrificial layer from said protective insulating film and said capacitance insulating film; and
    forming an upper electrode of said MIM capacitor opposite said lower electrode with said capacitance insulating film between said lower and upper electrodes.

2. The method for manufacturing a semiconductor device according to claim 1 wherein:
    said protective insulating film is $SiO_2$;
    said capacitance insulating film is SiN;
    said sacrificial layer is a fluorine-containing polymer; and
    in removing said sacrificial layer, selectively removing said sacrificial layer from said protective insulating film and said capacitance insulating film by exposing said sacrificial layer to an $O_2$ plasma.

* * * * *